(12) United States Patent
Dai

(10) Patent No.: US 9,030,584 B2
(45) Date of Patent: May 12, 2015

(54) IMAGE SENSOR WITH SUBSTRATE NOISE ISOLATION

(71) Applicant: OmniVision Technologies, Inc., Santa Clara, CA (US)

(72) Inventor: Tiejun Dai, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 172 days.

(21) Appl. No.: 13/846,418

(22) Filed: Mar. 18, 2013

(65) Prior Publication Data
US 2014/0267860 A1 Sep. 18, 2014

(51) Int. Cl.
| | |
|---|---|
| H04N 3/14 | (2006.01) |
| H04N 5/335 | (2011.01) |
| H04N 5/357 | (2011.01) |
| H01L 27/146 | (2006.01) |
| H01L 31/062 | (2012.01) |
| H01L 31/113 | (2006.01) |

(52) U.S. Cl.
CPC .......... *H04N 5/3577* (2013.01); *H01L 27/1463* (2013.01); *H01L 27/1464* (2013.01); *H01L 27/14687* (2013.01); *H01L 27/14689* (2013.01)

(58) Field of Classification Search
CPC ... H04N 5/374; H04N 5/3741; H04N 5/3742; H04N 3/1506; H04N 3/1512
USPC .................. 348/302, 308–311; 257/522, 774, 257/621–622, 292; 438/70, 430
See application file for complete search history.

(56) References Cited

U.S. PATENT DOCUMENTS

| | | | |
|---|---|---|---|
| 7,560,802 B2 | 7/2009 | Kalvesten et al. | |
| 2009/0201400 A1* | 8/2009 | Zhang et al. | 348/296 |
| 2010/0051785 A1* | 3/2010 | Dai et al. | 250/208.1 |
| 2010/0079649 A1 | 4/2010 | Ayraud | |
| 2011/0108939 A1* | 5/2011 | Marty et al. | 257/432 |
| 2012/0043589 A1* | 2/2012 | Nozaki et al. | 257/225 |
| 2012/0086844 A1* | 4/2012 | Dai et al. | 348/308 |
| 2013/0001728 A1* | 1/2013 | De Amicis | 257/435 |
| 2013/0017646 A1* | 1/2013 | Kim et al. | 438/72 |
| 2013/0323875 A1* | 12/2013 | Park et al. | 438/70 |

OTHER PUBLICATIONS

M. Purcell et al., "Image Artifacts Caused by Pixel Bias Cells in CMOS Imagers targeted for mobile applications," ST Microelectronics Imaging Division, 2009, 4 pages, Edinburgh, Scotland, UK.
P. Himes, "Vertical through-wafer insulation: Enabling integration and innovation," Solid State Technology, vol. 56, Issue 2, Mar. 2013, Silex Microsystems AB, Jarfalla, Sweden, pp. 13-17.
T. Bauer, "First High Volume Via Process for Packaging and Integration of MEMS / CMOS," Silex Microsystems, Jarfalla, Sweden, 2008, 6 pages.

* cited by examiner

*Primary Examiner* — Kelly L Jerabek
(74) *Attorney, Agent, or Firm* — Blakely Sokoloff Taylor & Zafman LLP

(57) ABSTRACT

A process including forming an a backside-illuminated (BSI) image sensor in a substrate, the image sensor including a pixel array formed in or near a front surface of the substrate and one or more circuit blocks formed in the substrate near the pixel array, each circuit block including at least one support circuit. An interconnect layer is formed on the front surface of the substrate that includes a dielectric within which are embedded traces and vias, wherein the traces and vias electrically couple the pixel array to at least one of the one or more support circuits. An isolation trench is formed surrounding at least one of the one or more circuit blocks to isolate the pixel array and other circuit blocks from noise generated by the at least one support circuit within the circuit block surrounded by the isolation trench. Other embodiments are disclosed and claimed.

18 Claims, 3 Drawing Sheets

IMAGE SENSOR WITH SUBSTRATE NOISE ISOLATION

TECHNICAL FIELD

The described embodiments relate generally to image sensors, and in particular, but not exclusively, to an image sensor with substrate noise isolation.

BACKGROUND

Image sensors are widely used in digital still cameras, cellular phones, security cameras, medical, automobile, and other applications. Complementary metal-oxide-semiconductor ("CMOS") technology is used to manufacture low-cost image sensors on silicon substrates.

Most CMOS image sensors include a two-dimensional array of pixels that are used to capture images. The pixel array is usually formed in and/or on a substrate along with various support circuits. The support circuits, as their name implies, support the operations of the pixel array to capture images. In many cases the substrate in which the pixel array and support circuits are formed is a semiconductor. Some types of support circuits can generate noise of sufficient levels that the noise can be transmitted electrically through the semiconductor substrate and adversely influence the operation of more noise-sensitive components such as the pixel array.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments are described of an apparatus, system and method for an image sensor with substrate noise isolation. Specific details are described to provide a thorough understanding of the embodiments, but one skilled in the relevant art will recognize that the invention can be practiced without one or more of the described details, or with other methods, components, materials, etc. In some instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one described embodiment. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1:
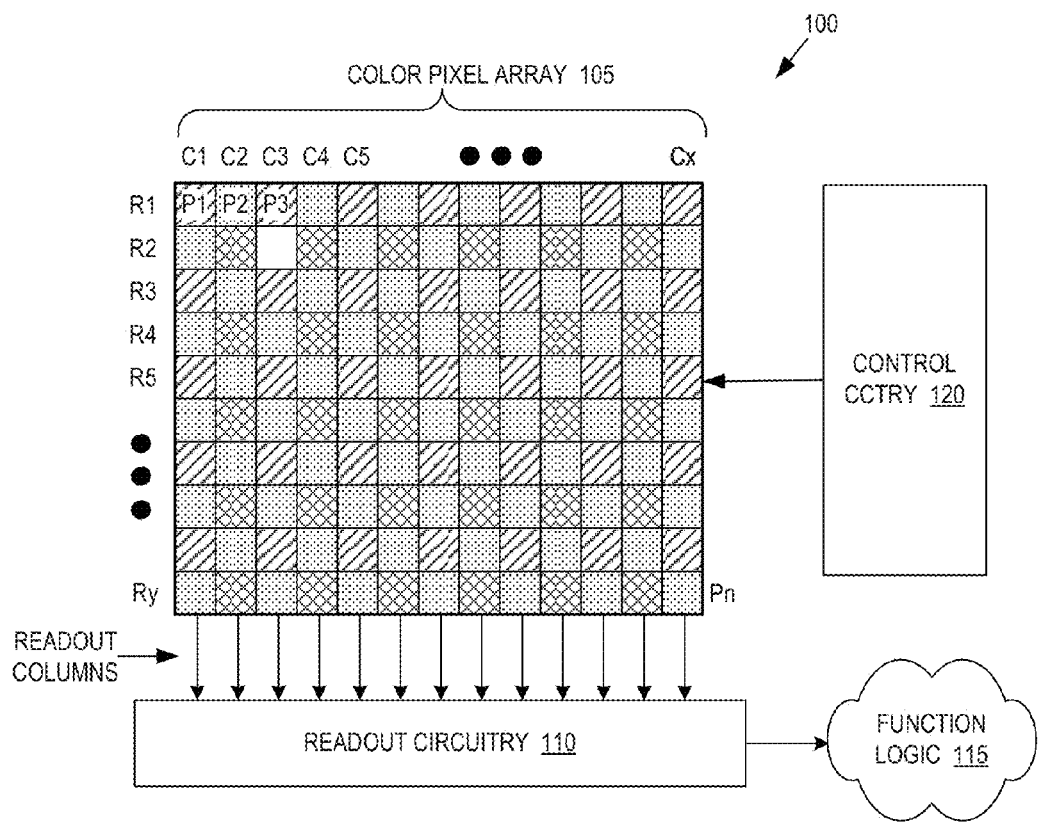
FIG. 1 is a schematic drawing of an embodiment of a complementary metal oxide semiconductor (CMOS) image sensor.

FIG. 1 illustrates an embodiment of a CMOS image sensor 100 including a pixel array 105, readout circuitry 110, function logic 115 coupled to the readout circuitry, and control circuitry 120 coupled to the pixel array. Other embodiments of image sensor 100 can include additional circuitry such as power management circuitry and signal processing circuitry. Pixel array 105 is a two-dimensional ("2D") array of imaging sensors or pixels (e.g., pixels P1, P2 . . . , Pn) having X pixel columns and Y pixel rows and can be implemented as either a frontside-illuminated pixel array or a backside-illuminated image pixel array. In one embodiment, each pixel in the pixel array is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object. In one embodiment, pixel array 105 can assign color to each pixel through the use of a color filter array ("CFA") coupled to the pixel array. CFAs assign a separate primary color to each pixel by placing a filter of that color over the pixel; thus, for example it is common to refer to a pixel as a "blue pixel" if it is coupled to a blue filter, a "green pixel" if it is coupled to a green filter, or a "red pixel" if it is coupled to a red filter. As photons pass through a filter of a certain primary color to reach the pixel, only wavelengths of that primary color pass through and all other wavelengths are absorbed.

After each pixel in pixel array 105 has acquired its image data or image charge, the image data is read out by readout circuitry 510 and transferred to function logic 115 for storage, additional processing, etc. Readout circuitry 110 may include amplification circuitry, analog-to-digital ("ADC") conversion circuitry, or otherwise, although in other embodiments some of this circuitry can be included in separate signal processing circuitry. Function logic 115 can simply store the image data or even manipulate the image data by applying post-image effects (e.g., crop, rotate, remove red eye, adjust brightness, adjust contrast, or otherwise).

Control circuitry 120 is coupled to pixel array 105 to control operational characteristic of pixel array 105. For example, control circuitry 120 may generate a shutter signal for controlling image acquisition.

Figure 2A:
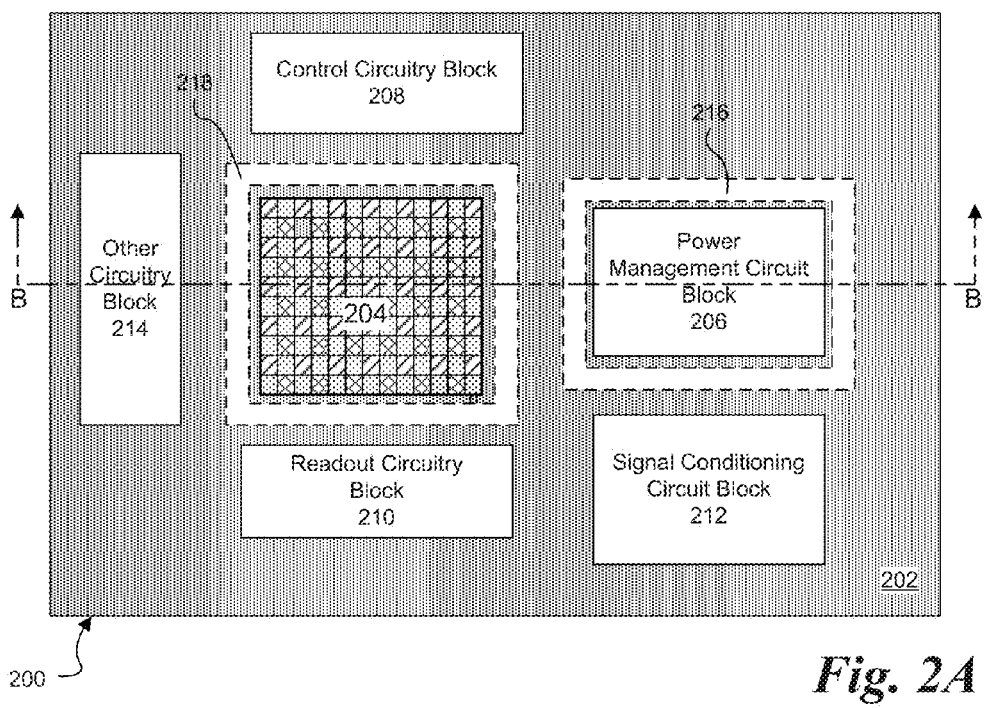
FIG. 2A is a plan view of an embodiment of an image sensor.
Figure 2B:
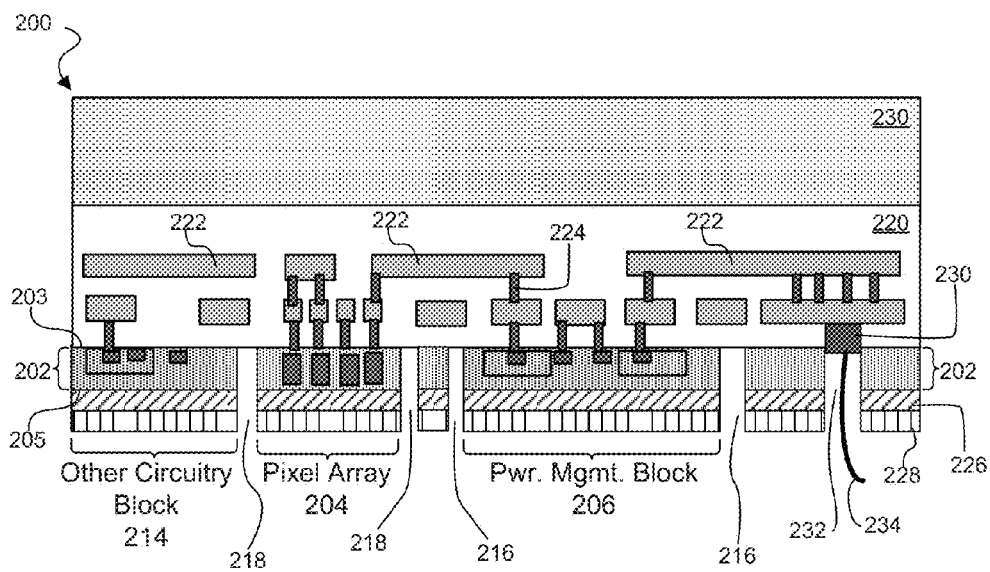
FIG. 2B is a cross-sectional drawing of the image sensor embodiment of FIG. 2A, taken substantially along section line B-B.

FIGS. 2A-2B together illustrate an embodiment of a backside-illuminated (BSI) image sensor 200. FIG. 2A is a plan view illustrating an arrangement of elements for image sensor 200. BSI image sensor 200 includes various elements formed in or on a substrate 202. Substrate 202 is generally a semiconductor, such as a doped or undoped epitaxial silicon layer. A pixel array 204 is formed in and/or on substrate 202; some components of pixel array 204 can be formed in the bulk of the substrate, while others can be formed on front surface 203 of the substrate (see FIG. 2B). Pixel array 204 can be a pixel array such as pixel array 105 described in connection with FIG. 1.

Positioned around the periphery of pixel array 204 are blocks of circuitry formed in or on substrate 202. Each circuitry block can include one or more circuits designed to perform functions that support the operation of pixel array 204. In the illustrated embodiment, the circuitry blocks around the periphery of pixel array 204 include a power management circuit block 206, which include can include a DCDC conversion circuit and/or other power management circuits. The circuitry blocks also include a control circuitry block 208 that performs the control functions described in connection with FIG. 1, a readout circuitry block 210 that also performs the functions described in connection with FIG. 1, a signal conditioning block 212, and an other circuitry block 214 that can perform other functions. Other embodiments of image sensor 200 can include a lesser or greater number of circuit blocks, and/or can have the circuit blocks position positioned differently than shown relative to the pixel array. Moreover, the circuit blocks themselves can include different groupings of circuits than described.

An isolation trench 216 is formed in substrate 202 surrounding block 206. Similarly, an isolation trench 218 is formed in substrate 202 surrounding pixel array 204. Isolation trench 216 completely surrounds pixel array 204, while isolation trench 218 completely surrounds power management circuit block 206. In the illustrated embodiment, pixel array 204 and power management circuit block 206 are surrounded, which isolates pixel array 204 and circuit block 206 from receiving or transmitting electrical noise through substrate 202. In other embodiments, a lesser or greater number of components can be surrounded with isolation trenches.

Isolation trenches 216 and 218 take up space in the substrate—that is, they take up substrate "real estate." The real estate taken up by the trenches will be unusable for other elements, so it is desirable to achieve the desired noise isolation while minimizing trenching. Generally, the most noise-sensitive elements or the most noise-generating circuits, or both, are candidates to be surrounded by isolation trenches. If there are few noise-sensitive circuits and many noise-generating circuits whose noise output exceeds a selected noise threshold (in one embodiment at least 10 times the noise sensitivity of the noise-sensitive element being isolated, but lower or higher in other embodiments), it can be more efficient to surround the noise-sensitive components instead of the noise-generating circuits. Alternatively, if noise-generating circuits are few and noise-sensitive components are many, then surrounding the noise-generating components can result in a more efficient use of substrate real estate.

FIG. 2B illustrates a cross-section of image sensor 200 taken along section line B-B in FIG. 2A. Pixel array 204, power management block 206 and other circuitry block 214 are shown formed in and/or on substrate 202. An interconnect layer 220 is formed on front surface 203 of substrate 202, and one or more additional layers 226 and 228 can optionally be formed on backside 205 of substrate 202.

Interconnect layer 220 includes electrically conductive traces 222 and vias 224 that are electrically coupled to, and carry signals between, pixel array 204 and circuit elements in the circuit blocks that are formed in substrate 202. Traces 222 and vias 224 can also carry signals to and from elements outside image sensor 200 via bond pad 230 and bond wire 234, for example. Within interconnect layer 220, traces 222 and vias 224 are embedded in a dielectric material. In the illustrated embodiment the dielectric material is monolithic, meaning it is a single uninterrupted piece of dielectric within which the traces and vias are embedded. In other embodiments, however, the dielectric used in interconnect layer 220 can be made of several layers of the same or different dielectric materials. Bond pad 230 can be electrically coupled to a trace and/or via and to some external element by wire 234 inserted through etched hole 232 to form an electrical contact with bond pad 230.

The one or more additional layers 226 and 228 are optionally formed on backside 205 of the substrate to perform additional functions that made be required or desirable. Examples of things that can be used for additional layers 226 and 228 are anti-reflective coatings, anti-scratch coatings, microlens arrays, color filter arrays, and so on.

Isolation trenches 216 and 218 extend through the entire thickness of substrate 202 and, if present, through additional layers 226 and 228. The trenches extend all the way through substrate 202 to the dielectric of interconnect layer 220, so that the substrate on which the particular element is formed is completely isolated from other parts of the substrate. Isolation trenches 216 and 218 can be formed in one embodiment by photolithographically patterning and then etching the back side of substrate 202 and, if present, the additional layers. In one embodiment, isolation trenches 216 and 218 can be formed at the same time and/or using the same process used to form bond pad hole 232 through the back side of substrate 202.

Figure 3:
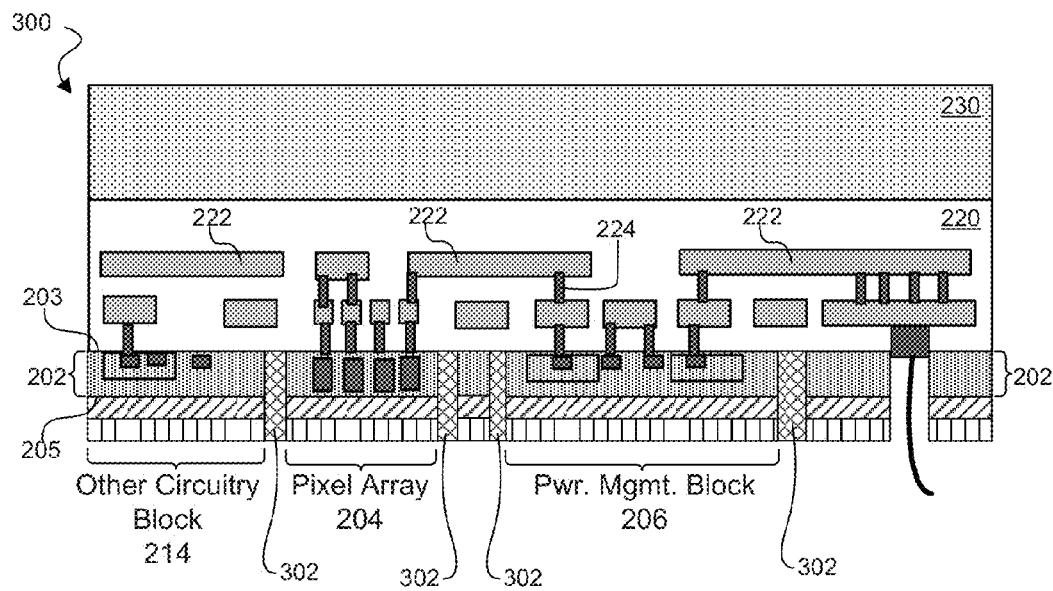
FIG. 3 is a cross-sectional drawing of another embodiment of an image sensor.

FIG. 3 illustrates a cross-section of another embodiment of an image sensor 300. In some embodiments it may be necessary to fill isolation trenches to maintain the structural integrity of the assembly, for example by preventing flexing and cracking in the thinner parts of the image sensor (e.g., in the isolation trenches), or by preventing the surrounded circuit blocks from falling out of the assembly. Image sensor 300 is in most respects similar to image sensor 200. The primary difference between image sensor 300 and image sensor 200 is that image sensor 300 fields isolation trenches 216 and 218 with a dielectric 302 to provide structural reinforcement of the image sensor. Dielectric 302 can be any kind of electrically insulating material that provides the necessary electrical insulation while also providing the desired or required structural strength.

Figure 4:
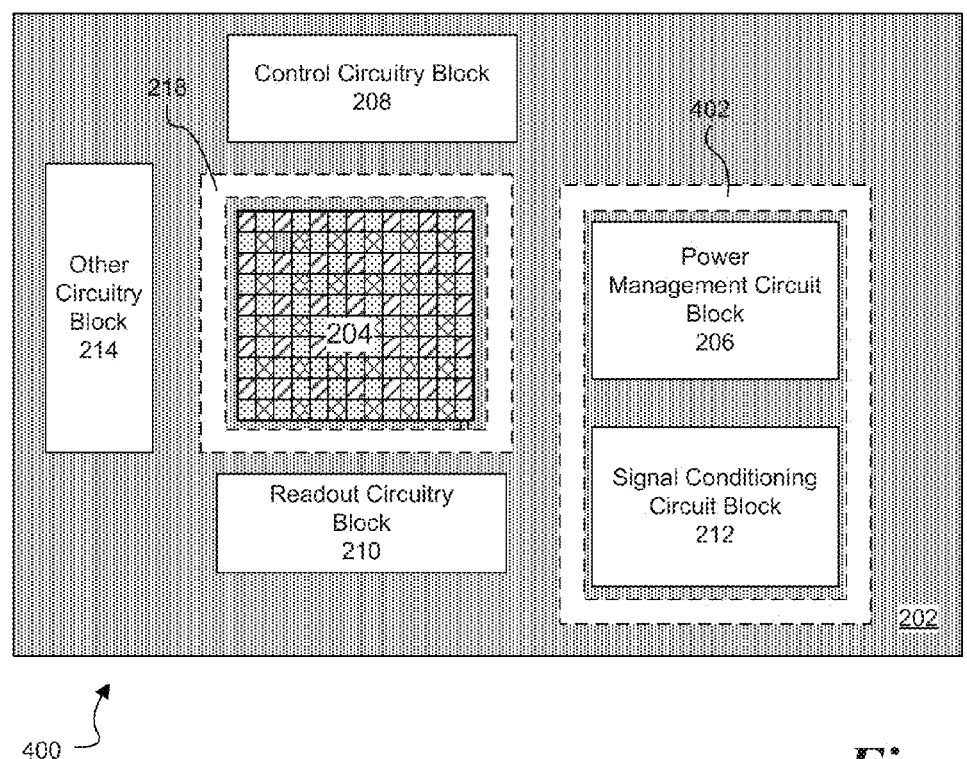
FIG. 4 is a plan view of yet another embodiment of an image sensor.

FIG. 4 illustrates a plan view of another embodiment of an image sensor 400. Image sensor 400 is in most respects similar to image sensor 200. The primary difference is that in image sensor 400 an isolation trench 402 surrounds more than one circuit block at a time. Surrounding more than one circuit block of time can be useful if there is more than one circuit block to be surrounded, because compared to forming an individual isolation trench around every element it can save substrate real estate. Surrounding multiple circuit blocks can also provide greater structural integrity since less of the substrate is etched away to form the isolation trench.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. A process comprising:
    forming a backside-illuminated (BSI) image sensor in a substrate, the image sensor including:
        a pixel array formed in or near a front surface of the substrate, and
        one or more circuit blocks formed in the substrate near the pixel array, each circuit block including at least one support circuit;
    forming an interconnect layer on the front surface of the substrate, the interconnect layer comprising a dielectric within which are embedded traces and vias, wherein the traces and vias electrically couple the pixel array to at least one of the one or more support circuits; and forming an isolation trench surrounding at least one of the one or more circuit blocks to isolate the pixel array and other circuit blocks from noise generated by the at least one support circuit within the circuit block surrounded by the isolation trench;

wherein the surrounded circuit block includes at least one support circuit whose noise exceeds a selected noise threshold and wherein the selected noise threshold is at least 10 the noise sensitivity of the pixel array.

2. The process of claim 1 wherein forming the isolation trench comprises:

photolithographically patterning the isolation trench on the back side of the substrate; and etching the isolation trench.

3. The process of claim 2 wherein etching the isolation trench comprises etching through the entire thickness of the substrate.

4. The process of claim 1, further comprising filling the isolation trench with a dielectric.

5. The process of claim 1, further comprising forming one or more additional layers on the back side of the substrate.

6. The process of claim 5 wherein the isolation trench extends through the one or more additional layers and through the entire thickness of the substrate.

7. The process of claim 5 wherein at least one of the one or more additional layers is an anti-reflective coating.

8. The process of claim 1, further comprising bonding a carrier wafer to the interconnect layer.

9. The process of claim 1 wherein the isolated circuit block includes a power management circuit or a DCDC conversion circuit.

10. The process of claim 1 wherein the isolation trench is formed at the same time and using the same process used to form bond pad holes in the substrate.

11. A backside-illuminated (BSI) image sensor comprising:

a pixel array formed in a front surface of a substrate;

one or more circuit blocks formed in the substrate near the pixel array, each circuit block including at least one support circuit;

an interconnect layer formed on the front surface of the substrate, the interconnect layers including a dielectric within which are embedded traces and vias, where the pixel array is electrically coupled to at least one of the one or more support circuits by the traces and vias; and an isolation trench formed in the substrate and completely surrounding at least one of the circuit blocks to isolate the pixel array from noise created by the one or more support circuits within the surrounded circuit block;

wherein the surrounded circuit block includes at least one support circuit whose noise exceeds a selected noise threshold and wherein the selected noise threshold is at least 10 times the noise sensitivity of the pixel array.

12. The image sensor of claim 11 wherein the depth of the isolation trench is equal to the thickness of the substrate.

13. The image sensor of claim 11 wherein the isolation trench is filled with a dielectric.

14. The image sensor of claim 11, further comprising one or more additional layers formed on the back side of the substrate.

15. The image sensor of claim 14 wherein the isolation trench extends through the one or more additional layers and through the entire thickness of the substrate.

16. The image sensor of claim 14 wherein at least one of the one or more additional layers is an anti-reflective coating.

17. The image sensor of claim 11, further comprising a carrier wafer bonded to the interconnect layer.

18. The image sensor of claim 11 wherein the isolated circuit block includes a power management circuit or a DCDC conversion circuit.

\* \* \* \* \*